United States Patent [19]
Ma et al.

[11] Patent Number: 5,345,114
[45] Date of Patent: Sep. 6, 1994

[54] SUPERCONDUCTOR LOGIC AND SWITCHING CIRCUITS

[76] Inventors: Qiyuan Ma; Walter N. Hardy, both of The University of British Columbia Office of Research Services and Industry Liaison, 2194 Health Sciences Mall, Room 331 - I.R.C. Building, Vancouver, British Columbia, Canada, V6T 1W5

[21] Appl. No.: 961,342

[22] Filed: Oct. 15, 1992

[51] Int. Cl.$^5$ ............... H03K 19/195; H03K 17/92
[52] U.S. Cl. .................................. 307/476; 307/245; 307/541; 341/171
[58] Field of Search .......... 307/476, 245, 541; 341/133, 171; 505/827, 858, 859, 860, 862, 882

[56] References Cited
U.S. PATENT DOCUMENTS

| | | | |
|---|---|---|---|
| 3,171,035 | 2/1965 | Clauser | 307/476 |
| 3,264,490 | 8/1966 | Gange | 307/476 |
| 3,304,466 | 2/1967 | Minnich et al. | 307/245 |
| 3,458,735 | 7/1969 | Fiske | 307/245 |
| 4,754,384 | 6/1988 | Levy et al. | 363/14 |
| 4,963,582 | 10/1990 | Drehman | 307/245 |
| 4,963,852 | 10/1990 | Drehman | 338/325 |

OTHER PUBLICATIONS

"Current Controlled High $T_c$ Superconducting Switch", Q. Y. Ma et al., Cryogenics, 30, p. 1146, (1990).
"Novel method of patterning YBaCuO superconducting thin films", Q. Y. Ma et al. Appl. Phys. Lett., 55, p. 896, (1989).
"Characterization of bilayer–metal contacts to high $T_c$ superconducting films", Q. Y. Ma et al, J. Vac. Sci. Technol. A9(3) p. 390, (1991).

*Primary Examiner*—Edward P. Westin
*Assistant Examiner*—Richard Roseen
*Attorney, Agent, or Firm*—Oyen Wiggs Green & Mutala

[57] ABSTRACT

Current controlled superconductor switches formed by reactive patterning or other fabrication techniques may be used to form logic circuits including OR, AND, NOR, NAND, and NOT gates, a circuit breaker or an analog-to-digital converter. Each switch contains a superconductor resistor electrically connected in parallel with a non-superconductor resistor. The superconductor resistor has a critical current $I_c$, such that it exhibits no electrical resistance to current flow less than $I_c$, and exhibits positive electrical resistance to current flow greater than or equal to $I_c$. The switch can accordingly be toggled between two states (i.e. superconducting and non-superconducting) by suitably controlling the current flowing through the switch. This switching behaviour provides the basis for constructing logic gates and other digital circuit devices.

17 Claims, 11 Drawing Sheets

SUPERCONDUCTOR LOGIC AND SWITCHING CIRCUITS

FIELD OF THE INVENTION

This application pertains to electronic logic circuits and to a circuit breaker made with current controlled superconducting switches formed of high critical temperature superconductor materials. The logic circuits include OR, AND, NOR, NAND, and NOT gates, as well as an analog-to-digital converter, with encoder.

BACKGROUND OF THE INVENTION

Unlike most conventional metallic superconductors, oxide high critical temperature superconductor ("$HT_cS$") materials (i.e. materials which exhibit superconducting characteristics at temperatures above liquid nitrogen temperature of 77 degrees Kelvin) have a large normal state resistivity. Typical resistivities of YBaCuO material at 100 degrees Kelvin ("° K") are of the order of 100 $\mu\Omega$-cm, which is at least one order of magnitude higher than that of metallic superconductors. The large difference in resistance between the normal state and the superconducting state is suitable for making high critical temperature ("$T_c$") superconducting switches that are compatible with many kinds of electronic circuits.

If the temperature of a $HT_cS$ material exceeds that material's $T_c$, then the material remains in a "normal" state in which it exhibits a large resistivity to an applied current. Similarly, if the current applied to a $HT_cS$ material exceeds the material's critical current ("$I_c$"), then the material will also remain in the "normal" state aforesaid. In the normal state, an electrical current passing through the $HT_cS$ material establishes an electrical voltage across the material, due to the normal resistance exhibited by the material. But, if the temperature of a $HT_cS$ material does not exceed that material's $T_c$; and, if the current applied to the $HT_cS$ material does not exceed that material's $I_c$, then the material switches to the superconducting state in which it exhibits essentially zero resistance to an applied current. In this application, the term "superconductor resistor" is used to refer to $HT_cS$ materials which are capable of exhibiting dual resistance states as aforesaid.

A $HT_cS$ material can be switched between the normal and superconducting states by modulating the current applied to the material. This is the basic principle of operation of a current controlled superconducting switch ("CCSS"). If the current applied to a CCSS device is less than $I_c$, then the device is superconductive with zero resistance, and no voltage is developed across the device (i.e. the switch is "off"). But, if the current applied to the device exceeds $I_c$, then the device switches to the normal resistive state and a voltage is developed across the device (i.e. the switch is turned "on"). A CCSS device can accordingly be constructed by electrically connecting a $HT_cS$ element in parallel with a fixed (i.e. non-superconducting) resistor element. An input current signal can be used to control the device's switching behaviour, with the voltage developed across the fixed resistor representing the output. When the input current signal is below $I_c$ of the $HT_cS$ element, all of the current flows through the $HT_cS$ element and no current flows through the fixed resistor so the voltage output across the fixed resistor is zero (i.e. the switch is "off"). If the input current signal exceeds the $HT_cS$ element's Ic, then the current is divided between the two circuit elements and a voltage develops across the fixed resistor (i.e. the switch is turned "on").

The present invention discloses how such CCSS devices can be adapted to the fabrication of logic gates, circuit breakers, or analog to digital converters, all of which are useful in the construction of low temperature digital electronic devices.

SUMMARY OF THE INVENTION

In accordance with the preferred embodiment, the invention provides a logic inverter gate having an input current source I. A superconductor resistor is electrically connected to the current source. The superconductor resistor has a critical current $I_c$, such that it exhibits a resistance of 0 ohms when $I<I_c$ and a resistance of $R_s$ ohms when $I \geq I_c$. A first non-superconductor resistor is electrically connected in series with the superconductor resistor. The first non-superconductor resistor has a resistance of r ohms and develops an output voltage $V_{out}$ in response to current flow. A second non-superconductor resistor is electrically connected in parallel across the two series-connected resistors. The second non-superconductor resistor has a resistance of R ohms. The resistance values are selected such that $r<<R<<R_s$. In operation, $I<I_c$ represents a first binary logical input signal to the inverter $I \geq I_c$ represents a second binary logical input signal, $V_{out} \approx I^*r$ represents a first binary logical output signal, and $V_{out} \approx I^*R^*r/R_s$ represents a second binary logical output signal.

The invention further provides a logic "NOR" gate having two input current sources $I_a$ and $I_b$. A superconductor resistor is electrically connected to the current sources. The superconductor resistor has a critical current $I_c$, such that it exhibits a resistance of 0 ohms when $I_a<I_c$ and $I_b<I_c$, and a resistance of $R_S$ ohms when $I_a \geq I_c$ or $I_b \geq I_c$. A first non-superconductor resistor is electrically connected in series with the superconductor resistor. The first non-superconductor resistor has a resistance of r ohms and develops an output voltage $V_{out}$ in response to current flow. A second non-superconductor resistor is electrically connected in parallel across the two series-connected resistors. The second non-superconductor resistor has a resistance of R ohms. The resistance values are selected such that $r<<R<<R_s$. In operation, $I_a<I_c$ or $I_b<I_c$ represents a first binary logical input signal to the gate, $I_a \geq I_c$ or $I_b \geq I_c$ (or both $I_a \geq I_c$ and $I_b \geq I_c$) represents a second binary logical input signal, $V_{out} \approx I^*r$ represents a first binary logical output signal of the gate, and $V_{out} \approx I^*R^*r/R_s$ represents a second binary logical output signal.

The invention further provides an logic "NAND" gate which may be driven by a plurality of current sources $I_k$, where $k=1, 2, \ldots, n$ and $n \geq 2$. A corresponding plurality of superconductor resistors are electrically connected in parallel with one another and to the current sources. Each superconductor resistor has a critical current $I_c$, 0 ohms resistance when conducting current $<I_c$, and a resistance of $R_s$ ohms when $\Sigma I_k > n^* I_c$. A first non-superconductor resistor is electrically connected in series with the superconductor resistors. The first non-superconductor resistor has r ohms resistance and develops an output voltage $V_{out}$ in response to current flow therethrough. A second non-superconductor resistor is electrically connected in parallel across the previously mentioned resistors. The second non-superconductor resistor has a resistance of R ohms. The resistance values are selected such that $r<<R<<R_s$. In operation, $0<I_k<I_c/n$ represents, for at least one value of k, a first binary logical input signal to the gate; $I_c<I_k<(n+1)I_c/n$ represents, for all values of k, a second binary logical input signal to the gate; $V_{out}\approx I*r$ represents a first binary logical output signal of the gate; and, $V_{out}\approx I*R*r/R_s$ represents a second binary logical output signal of the gate.

The superconductor resistors may be superconducting films deposited on a substrate and patterned into small structures by reactive patterning, chemical etching, ion milling, lithography, or similar fabrication techniques.

The invention further provides a circuit breaker for preventing a current I flowing through a superconductor circuit having a normal (i.e. non-superconductive) resistive load $r_L$ from exceeding a critical current $I_c$. A superconductor resistor is electrically connected to the current source and in series with the superconductor circuit. The superconductor resistor has a critical current $I_c$, such that it exhibits a resistance of 0 ohms when $I<I_c$ and a resistance of $R_s$ ohms when $I\geq I_c$. A non-superconductor resistor is electrically connected in parallel across the series-connected superconductor resistor and the electrical circuit. The non-superconductor resistor has a resistance of $R_L$ ohms. The resistance values are selected such that $r_L<<R_L<<R_s$. The non-superconductor resistor may be a light emitting diode or an alarm device.

The invention further provides an analog to digital converter for converting an input analog current signal I to a digital voltage signal within a range of digital voltage signals $V_1, V_2, \ldots V_n$, with each of the digital voltage signals corresponding to a selected magnitude portion of the analog signal. A plurality of identical current controlled superconductor switches are used to form the analog to digital converter. Each switch comprises a superconductor resistor electrically connected in parallel with a non-superconductor resistor. The superconductor resistor has a critical current $I_c$, such that it exhibits no electrical resistance to current flow less than $I_c$, and exhibits positive electrical resistance to current flow greater than or equal to $I_c$. The switches are arranged in a plurality of tiers $R_1, R_2, \ldots R_n$. The first tier $R_1$ has a single switch; the second tier $R_2$ has two switches electrically connected in parallel; the third tier $R_3$ has three switches electrically connected in parallel, and so on with each successive tier $R_i$ having an integer number "i" of switches electrically connected in parallel. The tiers are electrically connected in series with one another, such that the digital voltage signal $V_1$ is developed across the tier $R_1$ when $I\geq I_c$; the digital voltage signal $V_2$ is developed across the tier $R_2$ when $I\geq 2*I_c$; the digital voltage signal $V_3$ is developed across the corresponding tier $R_3$ when $I\geq 3*I_c$; and each successive tier $R_i$ develops a corresponding digital voltage signal $V_i$ when $I\geq i*I_c$.

DETAILED DESCRIPTION OF THE PREFERRED EMBODIMENT

Figure 1:
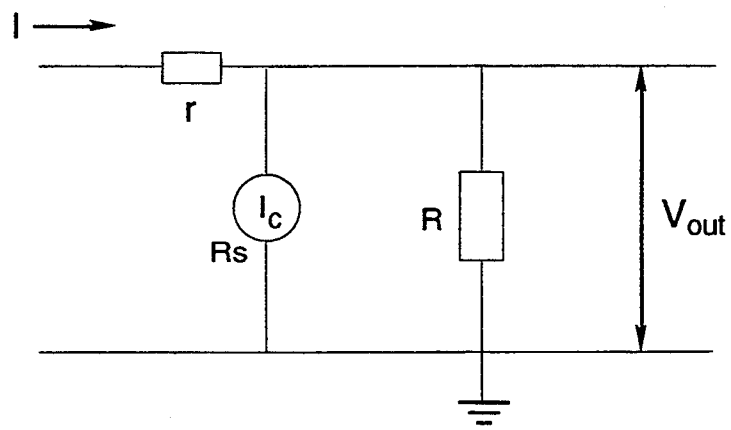
FIG. 1 is an electronic circuit schematic diagram of a current controlled superconducting switch ("CCSS").

FIG. 1 depicts a current controlled superconducting switch ("CCSS") in which a reactively patterned $HT_cS$ "superconductor resistor" $R_s$ having a critical current $I_c$ is electrically connected in parallel with a fixed external load resistor R. The input signal I is an alternating current. The output is the voltage $V_{out}$ developed across R. If $I<I_c$ and if the temperature of $HT_cS$ superconductor resistor $R_s$ is kept at or below 77° K., then all of the current will flow through resistor $R_s$ since it will be in the superconducting state at which it exhibits essentially zero resistance to electrical current flow. $V_{out}$ is zero in this case, corresponding to an "OFF" state. If $I>I_c$, then $R_s$ switches to the normal (i.e. non-superconducting) state in which it exhibits normal resistance to electrical current flow. In this case, the input current flows through both of resistors $R_s$ and R. $V_{out}$ is non-zero in this case, corresponding to an "ON" state.

Figure 2:
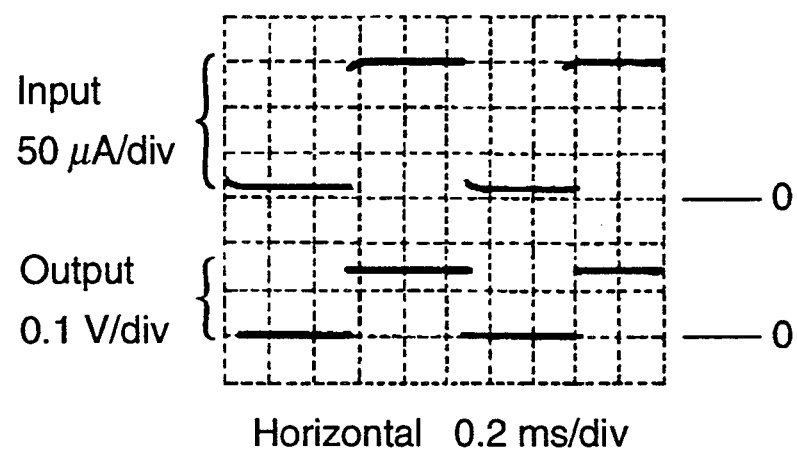
FIG. 2 is a graph showing input current (upper waveform) and output voltage (lower waveform) values for the CCSS of FIG. 1.

When $HT_cS$ resistor $R_s$ operates in the normal state the value of $V_{out}$ will depend upon the ratio of the resistance values of $R_s$ and R, i.e. $V_{out} \approx I*(R*R_s)/(R_s+R)$. In general, $R_s$ must be very large to exhibit a measurable switching behaviour. Ideally, one expects that $R_s = 0\Omega$ at temperatures of about 77° K. However, the contact resistance of the metal leads used to establish electrical connection with the $HT_cS$ line structure has been found to be about $0.1\Omega$ to $1\Omega$ for a Au-YBaCuO contact (see "Characterization of bilayer-metal contacts to high $T_c$ superconducting films", Q.Y. Ma et al, J. Vac. Sci. Technol. A9(3) p. 390, 1991). The normal state resistance of $R_s$ must be much larger than this value. Usually, one chooses $R_s$ to be in the range of $1\Omega$ to $100 k\Omega$ and R to be in the range of $0.1\Omega$ to 1 times the normal resistance value of $HT_cS$ resistor $R_s$. FIG. 2 shows input current and output voltage waveforms for a CCSS having $R_s = 2.3 k\Omega$, $R = 1.5 k\Omega$ and $I_c = 30 \mu A$. The input 1 kHz square wave (upper waveform in FIG. 2) generates a low current of 10 $\mu A$ and a high current of 150 $\mu A$. As can be seen, the output voltage of the device (lower waveform) switches between zero and 0.14 volts at 77° K. For a film with a large critical current density (over one million amperes per centimeter square) a smaller value of $R_s$ can be chosen for the switching measurement.

Figure 3A:
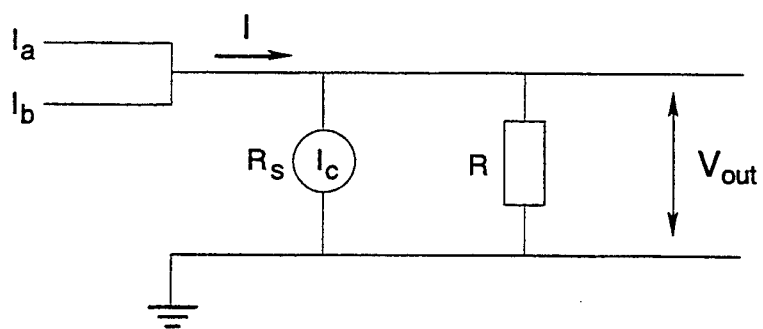
FIG. 3(a) is an electronic circuit schematic diagram of a logic "OR" gate constructed with a CCSS.
Figure 7:
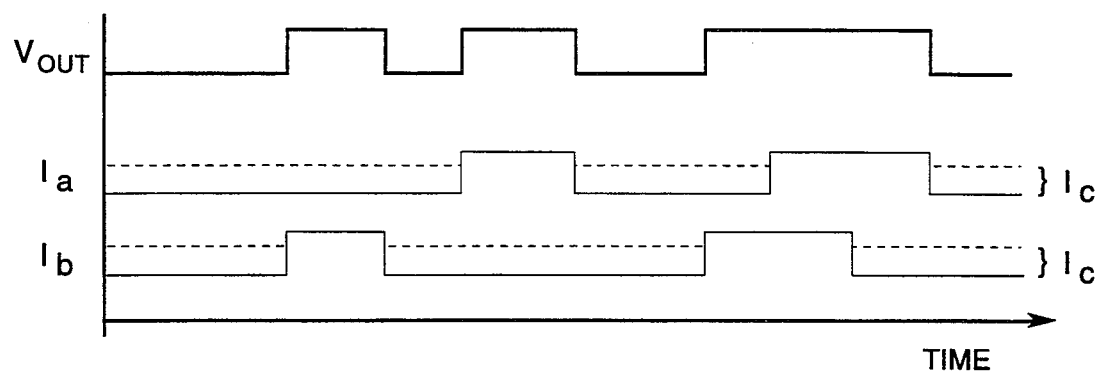
FIG. 7 is a graph of output voltage for the "OR" circuits of FIGS. 3(a) and 3(b) for various values of input currents $I_a$ and $I_b$.

A CCSS can be adapted to form various logic circuits, as will now be described with reference to FIGS. 3(a) through 3(h). As depicted in FIG. 3(a), an "OR" gate may be formed by applying two separate input current signals $I_a$ and $I_b$ to a CCSS device of the type described above with reference to FIG. 1. (In FIGS. 3(a) through 3(h), $R_s$ denotes a resistor formed of $HT_cS$ material having a critical current $I_c$, and R denotes a fixed, non-superconducting resistor.) As shown in FIG. 7, if either one or both of input signals $I_a$ or $I_b$ exceed $I_c$, then the gate is "ON" (i.e. $V_{out}$ is non-zero). If both input signals $I_a$ and $I_b$ remain less than $I_c$, then the gate is "OFF" (i.e. $V_{out}$ is zero).

Figure 3B:
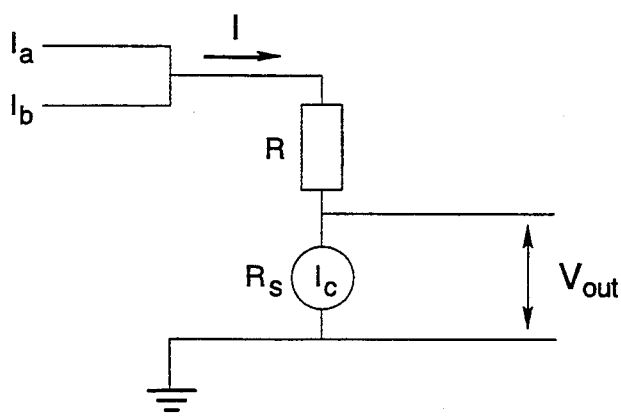
FIG. 3(b) is an electronic circuit schematic diagram of an alternative logic "OR" gate constructed with a CCSS.

FIG. 3(b) depicts an alternative "OR" gate formed by connecting fixed resistor R in series with $HT_cS$ resistor $R_s$, and by applying two separate input current signals $I_a$ and $I_b$ to the gate. The input condition required to turn the gate "ON" is again $I_a$ or $I_b > I_c$, with the gate remaining "OFF" if both $I_a$ and $I_b < I_c$. Note that the output signal $V_{out}$ is the voltage developed across $HT_cS$ resistor $R_s$ in both the FIG. 3(a) and 3(b) embodiments. The following "truth table" summarizes the input and output conditions for the "OR" gates of FIGS. 3(a) and 3(b):

| Input | | Output |
|---|---|---|
| $I_a$ | $I_b$ | $V_{out}$ |
| 0 | 0 | 0 |
| 1 | 0 | 1 |
| 0 | 1 | 1 |
| 1 | 1 | 1 | where a logical "0" input signal is represented by the condition that the input signal (i.e. $I_a$ or $I_b$) is less than $I_c$; a logical "1" input signal is represented by the condition that the input signal exceeds $I_c$; a logical "0" output signal is represented by the condition that $V_{out} = $ zero, and a logical "1" output signal is represented by the condition that $V_{out}$ is non-zero.

The following equations provide a comparison of the input power ("$P_i$") and output power ("$P_o$") conditions for the "OR" gates of FIGS. 3(a) and 3(b):

| For FIG. 3(a): | $V_{out}$ | $\approx$ | $I*(R*R_S)/(R+R_S) \approx I*R$ |
| | $P_i$ | = | $I^2*R$ |
| | $P_o$ | = | $I^2*R*[R/(R+R_S)]^2$ |
| For FIG. 3(b): | $V_{out}$ | $\approx$ | $I*R_S$ |
| | $P_i$ | = | $I^2*(R+R_S)$ |
| | $P_o$ | = | $I^2*R_S$ |

Thus, for FIG. 3(a) the output to input power ratio is $P_o/P_i = [R/(R+R_S)]^2$; for FIG. 3(b) the output to input power ratio is $P_o/P_i = R/(R+R_S)$; and, the matching power conditions ($R = R_S$) are $P_o = \frac{1}{4}P_i$, and $P_o = \frac{1}{2}P_i$ for FIGS. 3(a) and 3(b) respectively.

Figure 3C:
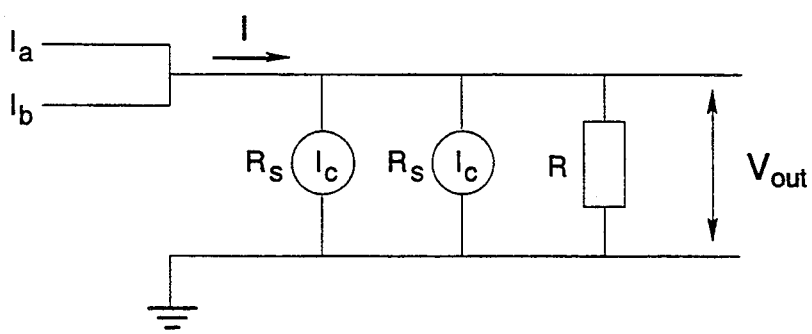
FIG. 3(c) is an electronic circuit schematic diagram of a logic "AND" gate constructed with a CCSS.
Figure 8:
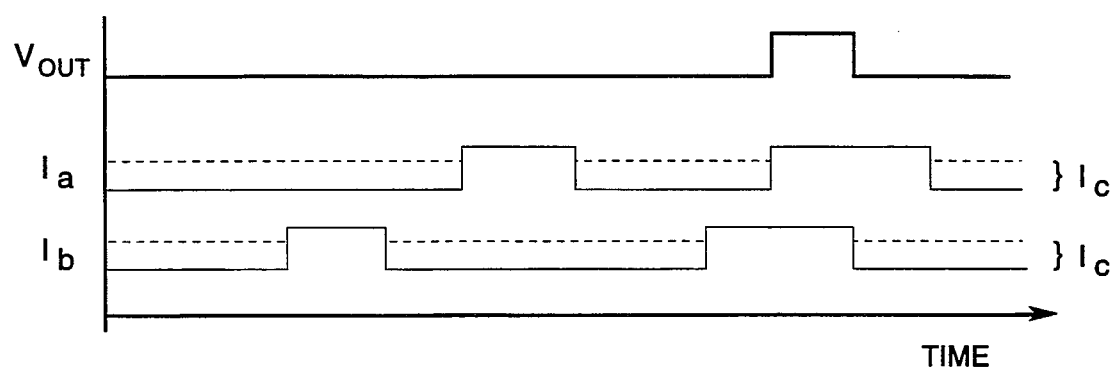
FIG. 8 is a graph of output voltage for the "AND" circuits of FIGS. 3(c) and 3(d) for various values of input currents $I_a$ and $I_b$.

As depicted in FIG. 3(c), an "AND" gate may be formed by connecting a second $HT_cS$ resistor in parallel across a CCSS device. The second $HT_cS$ resistor has the same critical current $I_c$ as the $HT_cS$ resistor in the CCSS device. Two input current signals $I_a$ or $I_b$ are applied to the gate. The input condition required to turn the gate "ON" is $I_a + I_b < 2*I_c$. As shown in FIG. 8, if $I_a$ or $I_b < I_c$, but $< 2*I_c$, then the gate remains "OFF".

Figure 3D:
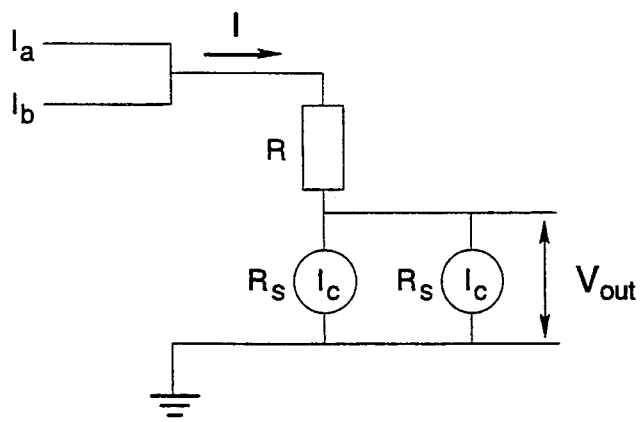
FIG. 3(d) is an electronic circuit schematic diagram of an alternative logic "AND" gate constructed with a CCSS.

FIG. 3(d) depicts an alternative "AND" gate formed by connecting fixed resistor R in series with two parallel-connected $HT_cS$ resistors $R_s$, and by applying two input current signals $I_a$ or $I_b$. The input condition required to turn the gate "ON" is again $I_a + I_b > 2*I_c$, with the gate remaining "OFF" if $I_a$ or $I_b < I_c$ and $> 2*I_c$. Note that the output signal $V_{out}$ is the voltage developed across the parallel-connected $HT_cS$ resistors in both the FIG. 3(c) and 3(d) embodiments. The following "truth table" summarizes the input and output conditions for the "AND" gates of FIGS. 3(c) and 3(d):

| Input | | Output |
|---|---|---|
| $I_a$ | $I_b$ | $V_{out}$ |
| 0 | 0 | 0 |
| 1 | 0 | 0 |
| 0 | 1 | 0 |
| 1 | 1 | 1 | where a logical "0" input signal is represented by the condition that the input signal (i.e. $I_a$ or $I_b$) is less than $I_c$; a logical "1" input signal is represented by the condition that the input signal exceeds $I_c$, but does not exceed twice the value of $I_c$; a logical "0" output signal is represented by the condition that $V_{out}$ is zero, and a logical "1" output signal is represented by the condition that $V_{out}$ is non-zero.

Figure 3E:
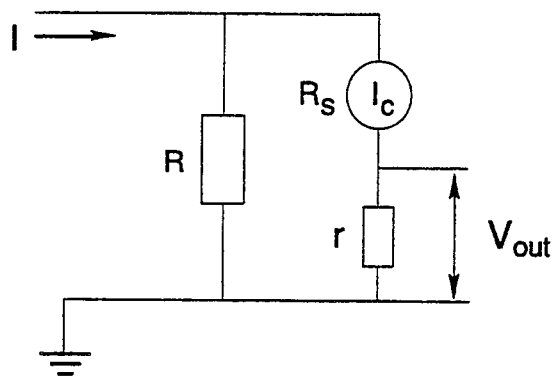
FIG. 3(e) is an electronic circuit schematic diagram of a logic "NOT" (i.e. inverter) gate constructed with a CCSS.
Figure 9:
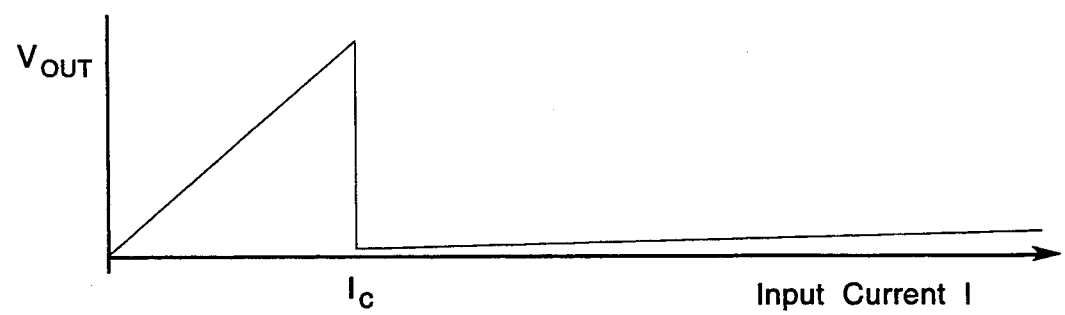
FIG. 9 is a plot of the output voltage for the "NOR" gate of FIG. 3(f) for various values of input currents $I_a$ and $I_b$.

As depicted in FIG. 3(e), a "NOT" (i.e. inverter) gate is formed by connecting a $HT_cS$ resistor $R_s$ in series with a small fixed resistor r, and by connecting a larger fixed resistor R in parallel across the two series-connected resistors. FIG. 9 is a graph of output voltage $V_{out}$ as a function of input current I for the circuit of FIG. 3(e). If $r << R << R_s$, and if the input current signal $I << I_c$, then most of the input current flows through the circuit loop containing $R_s$ and an output voltage $V_{out} \approx I*r$ is developed across r (i.e. the device is "ON"). If $I >> I_c$ then most of the input current flows through the circuit loop containing R and a smaller output voltage $V_{out} \approx I*R*r/(R+R_s+r) \approx I*R*r/R_s$ is developed across r (i.e. the device turns "OFF"). The following "truth table" summarizes the input and output conditions for the "NOT" gate of FIG. 3(e):

| Input | Output |
| --- | --- |
| I | $V_{out}$ |
| 0 | 1 |
| 1 | 0 | where a logical "0" input signal is represented by the condition that the input signal I is less than $I_c$; a logical "1" input signal is represented by the condition that the input signal exceeds $I_c$; a logical "1" output signal is represented by the condition that $V_{out}$ has a first value $I*r$; a logical "0" output signal is represented by the condition that $V_{out}$ has a second value $I*R*r/R_s$; and $r<<R<<R_s$.

Figure 3F:
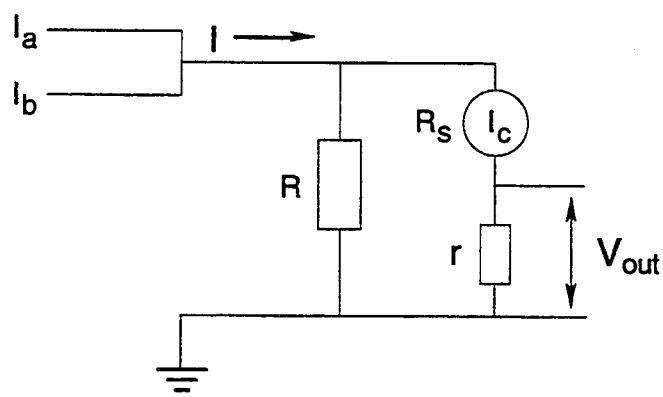
FIG. 3(f) is an electronic circuit schematic diagram of a logic "NOR" gate constructed with a CCSS.
Figure 10:
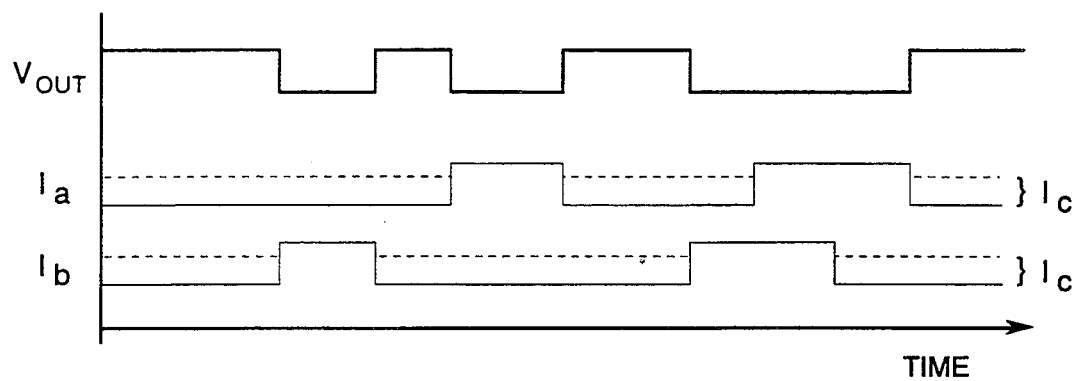
Figure 11:
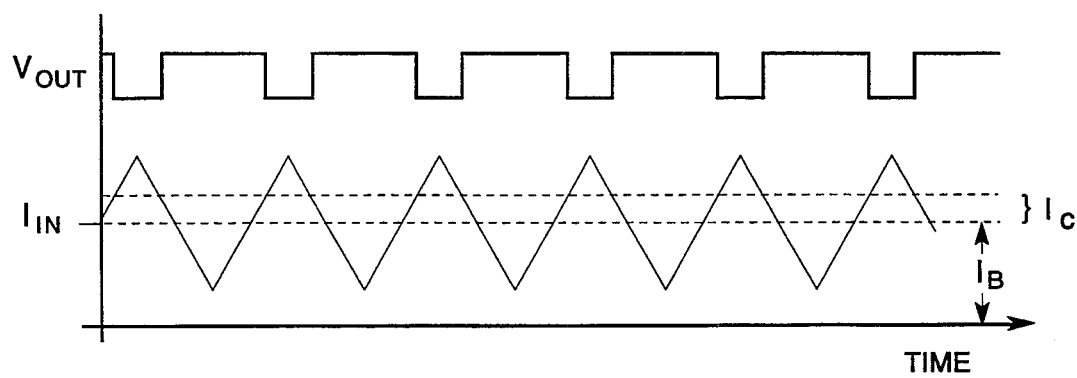
FIG. 11 is a graph of output voltage as a function of a varying input current for the biased "NOT" circuit of FIG. 3(g).

As depicted in FIG. 3(f) a "NOR" gate is formed by applying two input current signals $I_a$ and $I_b$ to the "NOT" gate of FIG. 3(e). As shown in FIG. 10, if both input signals $I_a$ and $I_b$ remain less than $I_c$, then the device turns "ON" (i.e. $V_{out} \approx Ir$). If either one or both of input signals $I_a$ or $I_b$ exceeds $I_c$, and if $I_a+I_b<2*I_c$ then the device turns "OFF" (i.e. $V_{out} \approx I*R*r/(R+R_s+r) \approx I*R*r/R_s$). The following "truth table" summarizes the input and output conditions for the "NOR" gate of FIG. 3(f):

| Input | | Output |
| --- | --- | --- |
| $I_a$ | $I_b$ | $V_{out}$ |
| 0 | 0 | 1 |
| 1 | 0 | 0 |
| 0 | 1 | 0 |
| 1 | 1 | 0 | where a logical "0" input signal is represented by the condition that the input signal (i.e. $I_a$ or $I_b$) is less than $I_c$; a logical "1" input signal is represented by the condition that the input signal exceeds $I_c$, but does not exceed twice the value of $I_c$; a logical "1" output signal is represented by the condition that $V_{out}$ has a first value $I*r$; a logical "0" output signal is represented by the condition that $V_{out}$ has a second value $I*R*r/R_s$; and $r<<R<<R_s$.

Figure 3G:
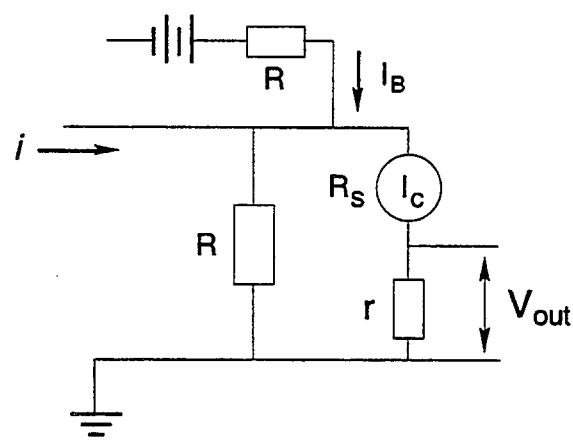
FIG. 3(g) shows how a bias current may be applied to the "NOT" gate of FIG. 3(e).

In many potential applications a current or voltage bias is required to reduce power consumption and/or to obtain current gain. This is particularly so in the case of integrated logic circuits. FIG. 3(g) shows how a direct current ("DC") bias signal may be applied to the "NOT" gate of FIG. 3(e). Those skilled in the art will understand that the same technique can be employed with other logic gates constructed in accordance with the present invention. Referring to FIG. 3 (g) and 11, DC bias current $I_B$ is applied to the input of the "NOT" gate. $I_B$ is slightly less than the critical current $I_c$ of superconductor resistor $R_s$. A small alternating current ("AC") signal i is applied to the "NOT" gate as an input signal. If the total applied current $I=I_B+i$ is less than $I_c$, then the device remains "ON" (i e. $V_{out} \approx I*r$) If $I>I_c$, the device is "OFF" (i.e. $V_{out} \approx I*r*R/R_s$). By biasing the device as aforesaid one need only apply a very small current i as a trigger to switch the device "ON" and "OFF".

Figure 3H:
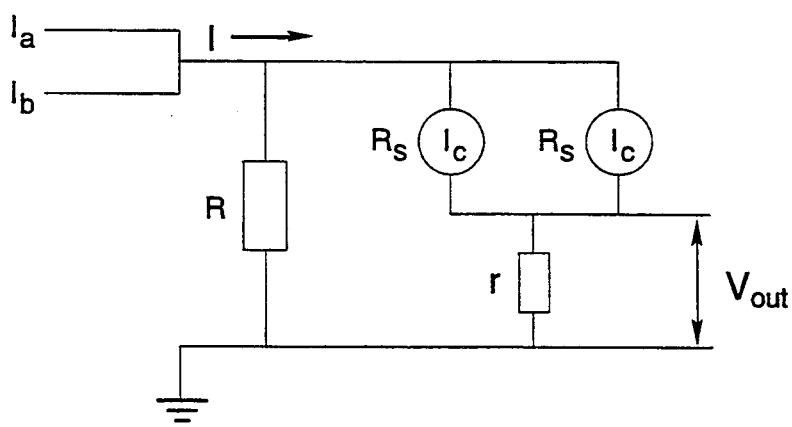
FIG. 3(h) is an electronic circuit schematic diagram of a logic "NAND" gate constructed with a CCSS.
Figure 12:
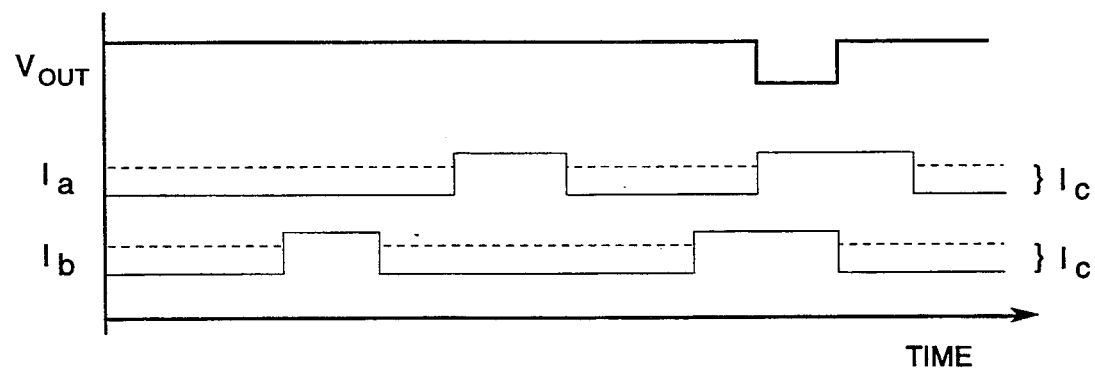
FIG. 12 is a graph of output voltage at various input currents $I_a$ and $I_b$ for the "NAND" circuit of FIG. 3(h).

As depicted in FIG. 3(h), the FIG. 3(e) "NOT" gate is converted into a "NAND" gate by connecting a second $HT_cS$ resistor $R_s$ in parallel across the first $HT_cS$ resistor, and by applying two input current signals $I_a$ and $I_b$ to the resultant circuit. As shown in FIG. 12, if either one or both of input signals $I_a$ and $I_b$ remain less than $I_c$, then the device remains "ON" (i.e. $V_{out} \approx I*r$).

If both input signals $I_a$ and $I_b$ exceed $I_c$, and if $I_a+I_b>2I_c$ then the device turns "OFF" (i.e. $V_{out} \approx I*R*r/(R+R_s+r) \approx I*R*r/R_s$). The following "truth table" summarizes the input and output conditions for the "NAND" gate of FIG. 3(h):

| Input | | Output |
| --- | --- | --- |
| $I_a$ | $I_b$ | $V_{out}$ |
| 0 | 0 | 1 |
| 1 | 0 | 1 |
| 0 | 1 | 1 |
| 1 | 1 | 0 | where the logical input and output signal conditions are the same as those described above for the NOR gate of FIG. 3(f). Those skilled in the art will understand that the FIG. 3(e) "NOT" gate may alternatively be converted into a "NAND" gate by substituting for the first $HT_cS$ resistor a different $HT_cS$ resistor (not shown) having a critical current value of $2*I_c$, and by applying two input current signals $I_a$ and $I_b$ to the resultant circuit, as aforesaid.

Figure 3I:
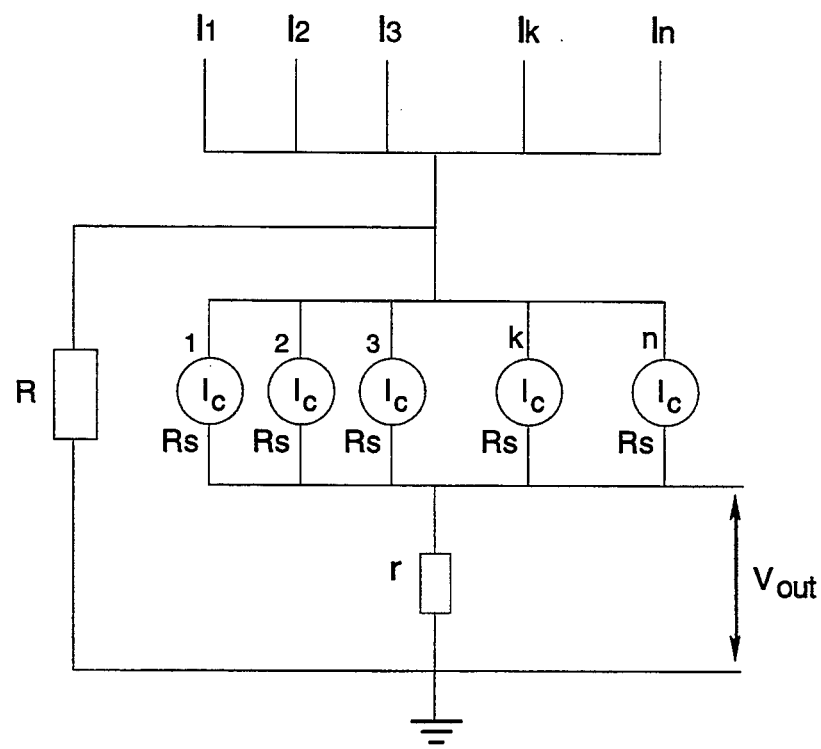
FIG. 3(i) is an electronic circuit schematic diagram of an "n" input logic "NAND" gate.
Figure 13:
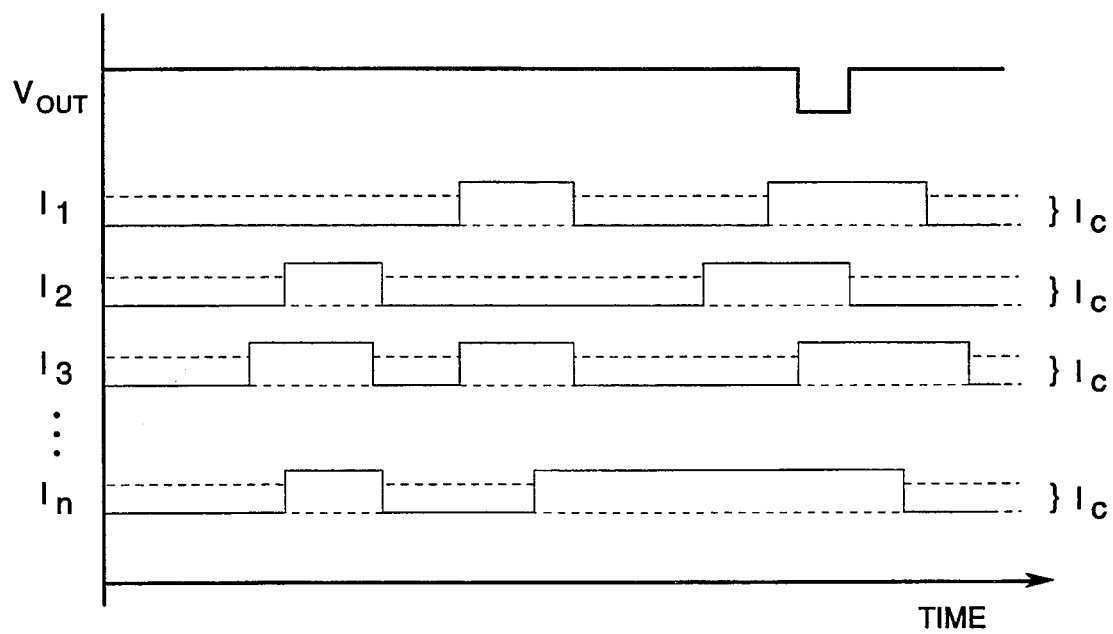
FIG. 13 is a graph of output voltage at various input currents $I_1 \ldots I_n$ for the n-input "NAND" circuit of FIG. 3(i).

More generally, as shown in FIG. 3(i), the FIG. 3(e) "NOT" gate may be converted into an "n" input "NAND" gate by substituting for the first $HT_cS$ resistor a plurality of "n" $HT_cS$ resistors each having a critical current value of $I_c$ and by applying a corresponding plurality of "n" input current signals $I_a$, $I_b$, $I_c$... to the resultant device. A logic "0" or "OFF" input condition is defined as $0<I_k<I_c/n$ where $k=1, 2, 3 \ldots n$. A logic "1" or "ON" input condition is defined as $I_c<I_k<(n+1) I_c/n$. To perform the NAND function, the device's output must remain "ON" if any one or more of the input current signals $I_k$ is "OFF", and switch to the "OFF" state if all of the input current signals $I_k$ are "ON". Thus, the minimum total input current $\Sigma I_k$ required to switch the device "OFF" is $n*I_c$. The FIG. 3(i) device satisfies these requirements. Assume for example that all but one of the input current signals $I_k$ are "ON" with the one remaining input current signal being "OFF". The total current $\Sigma I_k$ applied to the device is therefore $\Sigma I_k<(n-1)(n+1)I_c/n+I_c/n=(n^2--1)I_c/n+I_c/n=nI_c$. Accordingly $\Sigma I_k<nI_c$, so the $HT_cS$ resistors are not all switched to the normal state and the device's output remains "ON". But, as shown in FIG. 13, if all of the input current signals $I_k$ are "ON", then $\Sigma I_k>nI_c$ so the $HT_cS$ resistors are all switched to the normal state and the device's output turns "OFF".

Figure 4:
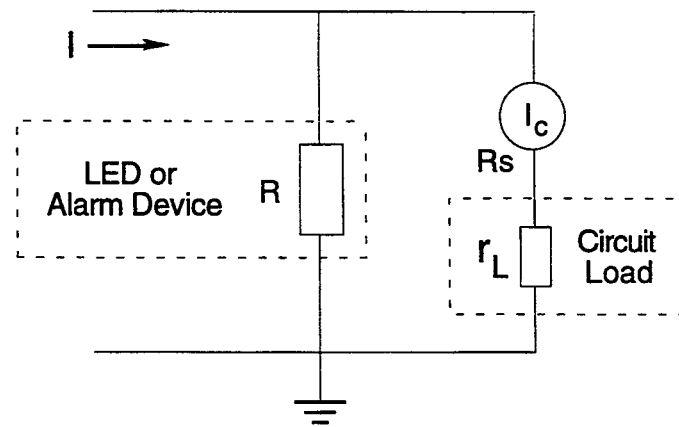
FIG. 4 is an electronic circuit schematic diagram of a current overdrive protection circuit breaker constructed with a CCSS.

As depicted in FIG. 4, a circuit breaker may be formed by connecting a superconductor resistor $R_s$ in series with a effective resistance $r_L$ and by connecting a non-superconducting resistor R in parallel across the two series-connected resistors. The circuit breaker can be used to prevent excess current from flowing in $r_L$ which, in practice, represents the normal resistance of a superconducting device or the effective resistance of some other circuit which is to be protected. R can be a light emitting diode ("LED") or an alarm device. If $r_L<<R<<R_s$, then if the input current I exceeds $I_c$ (which could be the maximum current sustainable by the $r_L$ loop), $R_s$ switches to the normal resistive (i.e. non-superconducting) state. A portion of the input current then flows in the R loop, thus triggering the LED or alarm device. If I remains less than $I_c$, then it flows through the $R_s$-$r_L$ loop to drive the working device. It will be noted that the circuit breaker is self-resetting, in that the device switches repetitively between the normal and superconducting states, depending upon the variation of I relative to $I_c$.

Figure 5:
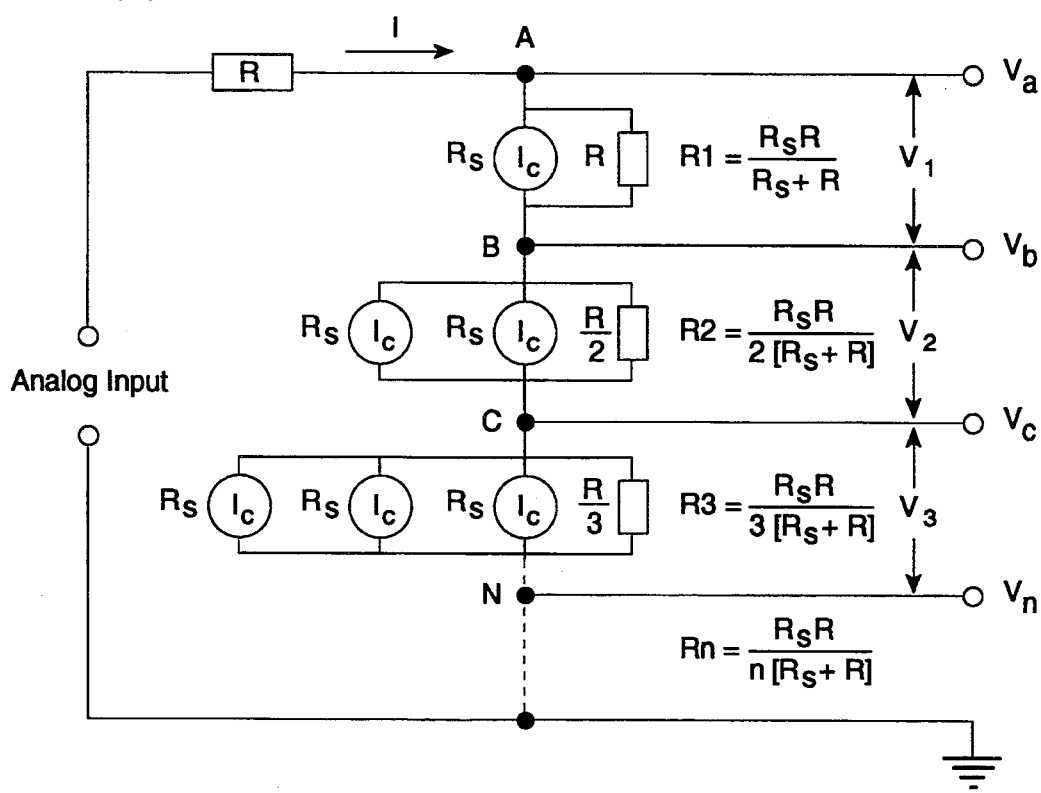
FIG. 5(a) is an electronic circuit schematic diagram of an analog to digital converter constructed with CCSS elements.
FIG. 5(b) is an electronic circuit schematic diagram of an alternative analog to digital converter.
Figure 5:
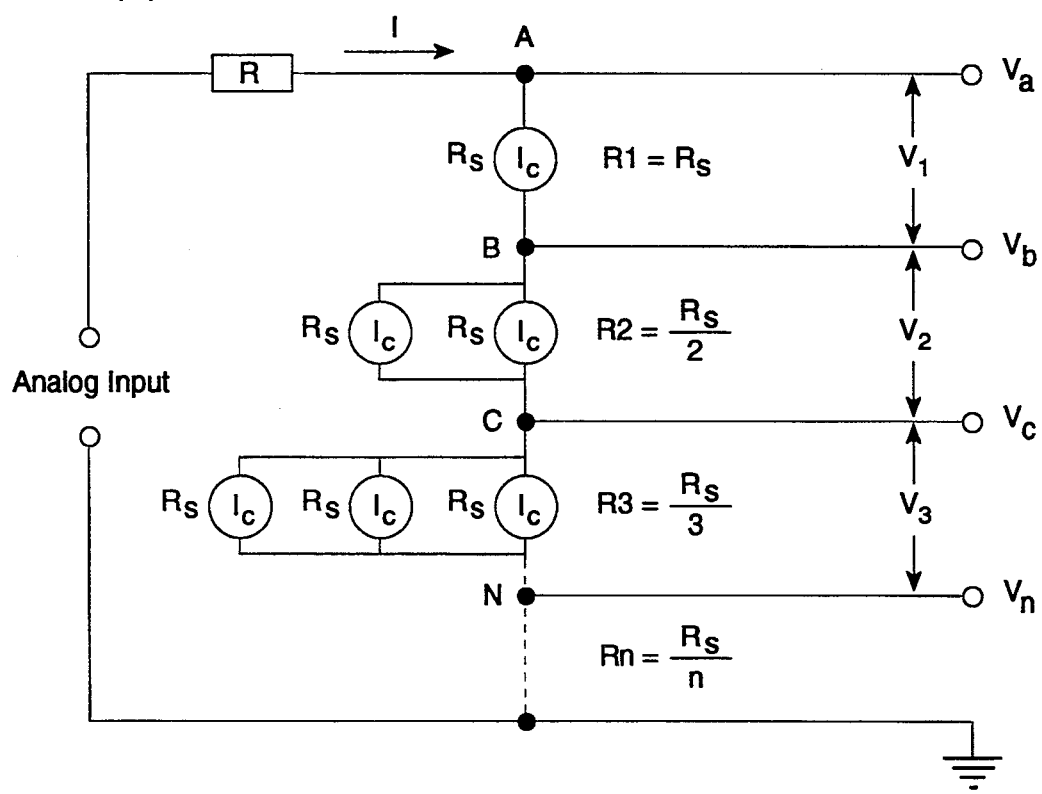

FIG. 5(a) depicts an analog to digital converter constructed with a plurality of identical CCSS devices of the type described above with reference to FIG. 1, each having a critical current $I_c$ and having a normal (i.e. non-superconducting) resistance $R_s$. As may be seen, the circuit comprises a series-connected cascade of successively increasing numbers of parallel-connected CCSS devices. The circuit is constructed such that the first tier comprises a single CCSS device having a resistance value $R_1=R_s*R/(R_s+R)$. The second tier comprises two parallel-connected CCSS devices identical to the device used to form the first tier, such that the resistance value of the second tier $R_2=R_1/2$. The third tier comprises three parallel-connected CCSS devices identical to the other CCSS devices, such that the resistance value of the third tier $R_3=R_1/3$. Further tiers could be added to extend the conversion range of the device, if desired, with the resistance value of the $n^{th}$ tier $R_n=R_1/n$.

Figure 14:
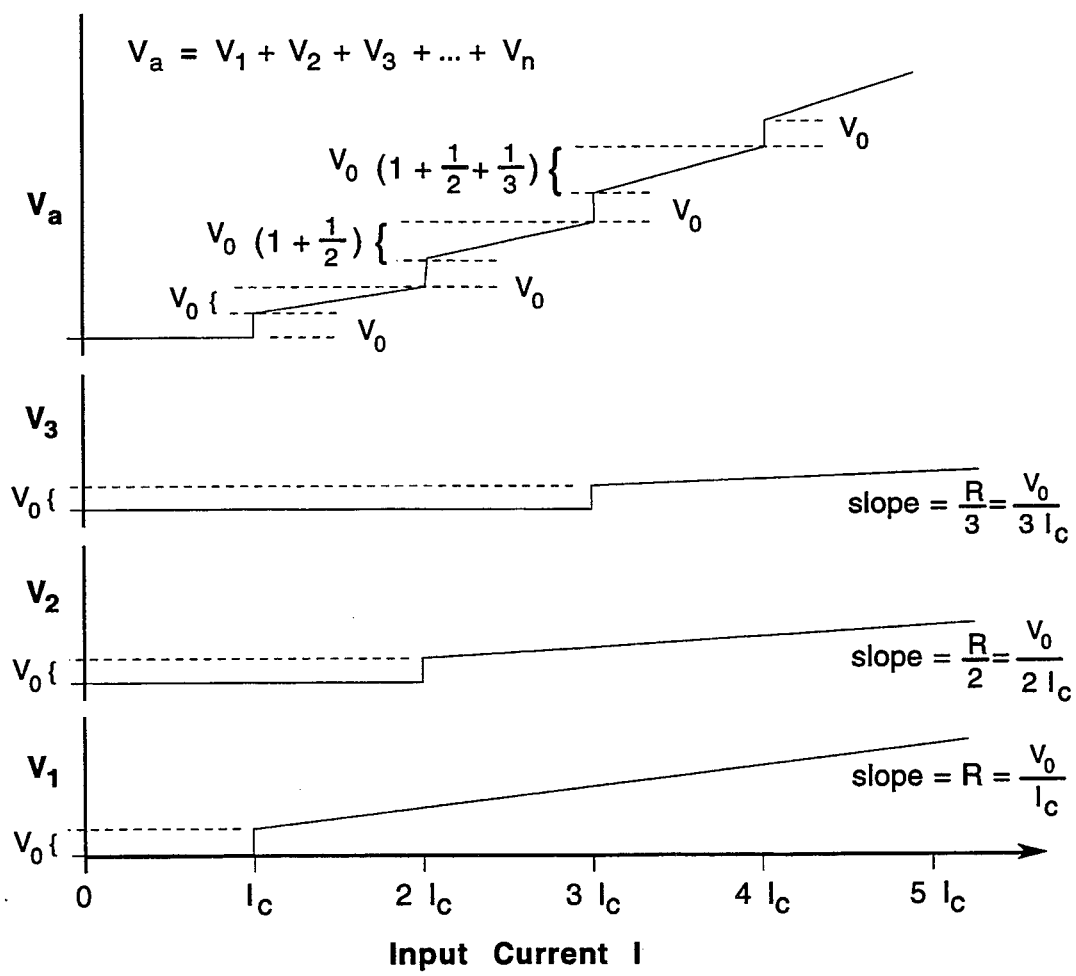
FIG. 14 is a graph of output voltages versus input current for the analog to digital convertor circuit of FIG. 5(a).

The input analog signal which is to be digitized is applied across the device, as shown. This causes a current I to flow through a normal (i.e. non-superconducting) fixed resistor R which is connected in series with the device. The digitized output signals $V_1$, $V_2$, $V_3$, ... $V_n$ are the voltages developed across each of the corresponding tiers $R_1$, $R_2$, $R_3$, ... $R_n$ respectively. In operation, as shown in FIG. 14, when the input current I reaches the critical current $I_c$ of CCSS tier $R_1$, that tier switches from the superconducting state (in which $V_1=0$) to the normal resistivity state (in which $V_1 \approx I_c*R$ if $R_s>>R$). For convenience, the term $V_o$ is defined such that $V_o=I_c*R$. Provided $I<2*I_c$, tiers $R_2$, $R_3$, ... $R_n$ remain in the superconducting state (i.e. $V_2=V_3...=V_n=0$). Accordingly, the voltage $V_a$ at point $A=V_1=V_o$; and, $V_b=V_c=...=V_n=0$.

If the input current I reaches $2*I_c$, then CCSS tier $R_1$ remains in the normal state and CCSS tier $R_2$ switches from the superconducting state (in which $V_2=0$) to the normal resistivity state (in which $V_2 \approx 2*I_c*R/2=V_o$). In this case, $V_a=V_1+V_2=2*I_c*R+V_o=3*V_o$; $V_b=V_o$; and, $V_c...V_n 0$. Provided $I<3*I_c$, tiers $R_3$ . . . $R_n$ remain in the superconducting state (i.e. $V_3 ... V_n=0$).

If the input current I reaches $3*I$ then CCSS tiers $R_1$ and $R_2$ remain in the normal state and CCSS tier $R_3$ switches from the superconducting state (in which $V_3=0$) to the normal resistivity state (in which $V_3 \approx 3*I_c*R/3=V_o$). In this case, $V_c=V_o$; $V_b=V_2+V_3=3*I_c*R/2+V_o=5*V_o/2$; $V_a=V_1+V_b=3*V_o+5*V_o/2=11*V_o/2$; and, $V_d$ . . . $V_n=0$. Provided $I<4*I_c$ any further tiers $R_4$ ... $R_n$ (not shown) remain in the superconducting state (i.e. $V_4$ ... $V_n=0$).

In general, if the input current I reaches $n*I_c$ then CCSS tiers $R_1, R_2 ... R_{n-1}$ remain in the normal state and CCSS tier $R_n$ switches from the superconducting state (in which $V_n=0$) to the normal resistivity state (in which $V_n=n*I_c*R/n=V_o$). If the input current I subsequently falls below $n*I_c$, then CCSS tier $R_n$ switches from the normal resistivity state back to the superconducting state in which $V_n=0$. Provided $I>(n-1)*I_c$ tiers $R_1, R_2 ... R_{n-1}$ remain in the normal resistivity state (i.e. $V_1=V_2... =V_{n-1}=V_o$). Consequently, if I falls below $3*I_c$ then CCSS tier $R_3$ switches back to the superconducting state, such that $V_3$ . . . $V_n=0$, with $V_b=V_2=V_o$ and $V_a=V_1+V_2=3*V_o$, provided $I>2*I_c$. If I falls below $2*I_c$ then CCSS tier $R_2$ switches back to the superconducting state, such that $V_2=V_3$ . . . $V_n=0$ or $V_b=V_c$ . . . $V_n=0$, with $V_a=V_1=V_o$, provided $I>I_c$. If I falls below $I_c$ then CCSS tier $R_1$ switches back to the superconducting state, such that $V_a=V_b=V_c... =V_1=V_2=V_3... V_n=0$. The following table summarizes the input and output conditions for the analog to digital converter of FIG. 5(a):

| I | $V_a$ | $V_b$ | $V_c$ | ... | $V_n$ |
|---|---|---|---|---|---|
| $I_c$ | 1 | 0 | 0 | ... | 0 |
| $2*I_c$ | 1 | 1 | 0 | ... | 0 |
| $3*I_c$ | 1 | 1 | 1 | ... | 0 |
| $n*I_c$ | 1 | 1 | 1 | ... | 1 | where a logical "0" output signal is represented by an output voltage of zero (or a small voltage value), and a logical "1" output signal is represented by a non-zero output voltage (or a large voltage value).

FIG. 5(b) illustrates an alternative technique for constructing an analog to digital converter using circuit components identical to those shown in FIG. 5(a), except that the CCSS devices are replaced by superconductor resistors which are connected in such a way that $R_1=R_s$ when $I>I_c$, $R_2=R_s/2$ when $I>2*I_c$, . . . $R_n=R_s/n$ when $I>n*I_c$. The analog to digital conversion performance of the FIG. 5(b) circuit is very similar to that of the FIG. 5(a) circuit, except that the output voltage $V_o$ is defined as $I_c*R$ in the case of the FIG. 5(b) circuit.

The output of an analog to digital converter of the type shown in FIGS. 5(a) or 5(b) is a set of quantized voltage values (i.e. $V_a$, $V_b$, ... $V_n$). A code word [$B_0$, $B_1$, ... $B_k$] can be assigned to further convert each input signal into a compact code associated uniquely with that signal. Devices capable of performing such conversion are called encoders and are typically characterized as having an n-bit-wide input and a k-bit-wide output, with n usually being greater than k.

Figure 6:
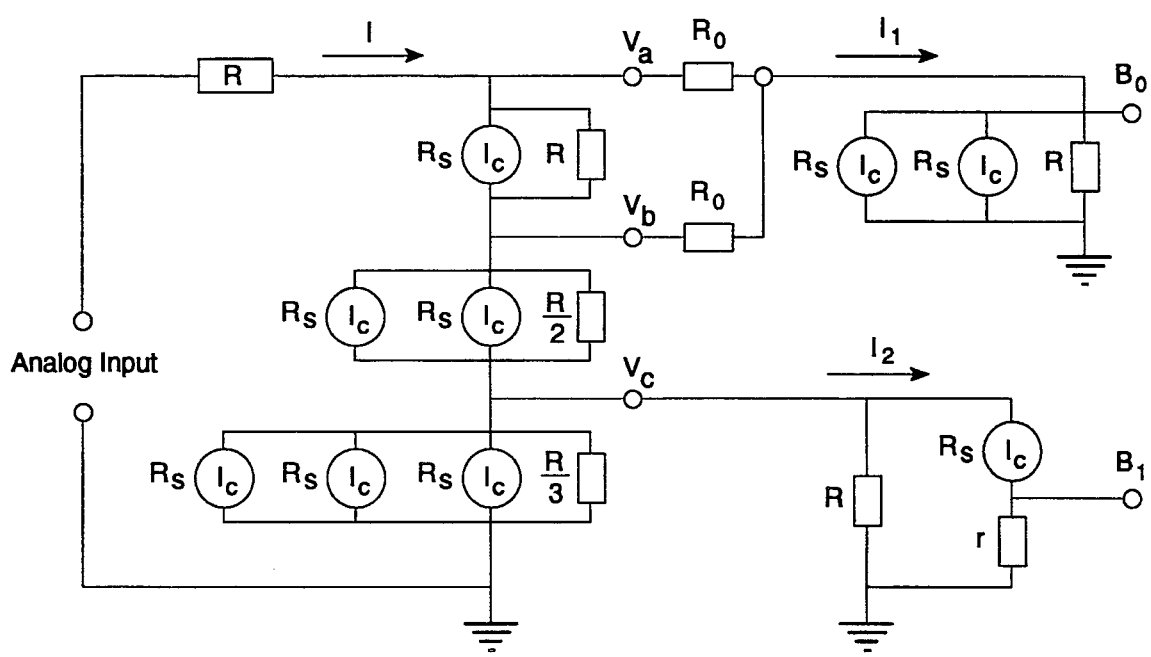
FIG. 6 is an electronic circuit schematic diagram of an analog to digital converter with a two-bit encoder.

FIG. 6 depicts an analog to digital converter with a two-bit encoder. The analog to digital converter portion of the FIG. 6 circuit is identical to the analog to digital converter described above with reference to FIG. 5(a). The analog input current is accordingly first converted into three digitized values $V_a$, $V_b$, and $V_c$ as previously explained. These three values are then each translated into a more compact, 2-bit code [$B_0$, $B_1$] by the encoder portion of the circuit, which consists of an AND gate like the one described above with reference to FIG. 3(c), and a NOT gate as described above with reference to FIG. 3(e).

The input of the AND gate is connected to both the $V_a$ and the $V_b$ terminals of the analog to digital converter. The output of the AND gate is the voltage $B_0$ developed across the AND gate's non-superconductor resistor R. The input of the NOT gate is connected to the $V_c$ terminal of the analog to digital converter. The output of the NOT gate is the voltage $B_1$ developed across the NOT gate's non-superconductor resistor r. Buffer resistors $R_o$ are inserted between the $V_a$ and $V_b$ terminals and the two inputs of the AND gate to prevent the majority of the current flow from bypassing the analog to digital converter through the encoder. The superconductor resistors $R_s$ in the AND gate are selected so that their critical current $i_c<<I_c$, where $I_c$ is the critical current of the superconductor resistors in the analog to digital converter.

In operation, $R_o>R>r$ and $I_c>>i_c$. For example, one may select $R_o=10*R$ and $i_c=I_c/10$. If $I=0$, then $V_a=V_b=V_c=B_0=B_1=0$. If I rises slightly above $I_c$ (say $I\approx1.1*I_c$), then $V_a=1$ and $V_b=V_c=0$ (it being understood that "0" and "1" are logical variables corresponding to small and a large voltage values, respectively). One tenth of the input current flows through the AND gate, so $I_1=0.1*I_c=i_c<2*i_c$. Therefore, $B_0$ is low or "0". A small portion $I_2$ of the input current I flows through the NOT gate, which is "ON", outputting a high voltage $B_1=I_2*r$ (i.e. $B_1=$"1"). If the input current rises above $2*I_c$, then $V_b=V_a=1$, and $V_c=0$. In this case $I_1$ is well above $2*i_c$, so the AND gate turns "ON" and $B_0=1$. The NOT gate remains "ON" (i.e. $B_1=$"1"). If the input current rises above $3*I_c$, then $V_a=V_b=V_c=1$. The current $I_2$ becomes large, turning the NOT gate "OFF" (i.e. $B_1=$"0"). The AND gate remains "ON" (i.e. $B_0=$"1"). The following table summarizes the input and output conditions for the analog to digital converter/encoder of FIG. 6:

| Input | A/D Converter Output | | | Encoder Output | |
|---|---|---|---|---|---|
| I | $V_a$ | $V_b$ | $V_c$ | $B_0$ | $B_1$ |
| 0 | 0 | 0 | 0 | 0 | 0 |
| $I_c$ | 1 | 0 | 0 | 0 | 1 |
| $2*I_c$ | 1 | 1 | 0 | 1 | 1 |
| $3*I_c$ | 1 | 1 | 1 | 1 | 0 |

The encoder can be built by selecting different combinations of logic gates. In the example of the two-bit encoder of FIG. 6, an AND gate and a NOT gate are used to perform the digital encoding function. The same function may be performed by constructing the encoder with other logic gate combinations. For example, a two-input NAND gate could receive the $V_a$ and $V_c$ signals with the $B_1$ output being tied directly to $V_b$. The conversion range of the analog to digital converter can be extended as described above, if desired. The conversion range of the encoder can be similarly extended, using multiple input logic gates for the encoder (see for example the foregoing description of the manner in which the NOT gate of FIG. 3(e) may be converted into an "n" input "NAND" gate).

Conventional logic circuits are now commercially made of transistors which are typically semiconductor field effect transistors ("FET"). Each logic gate normally comprises several FETs. Formation of such a gate requires complicated circuit design, multilevel device structures, and very sophisticated fabrication technologies. Logic circuits constructed in accordance with the present invention may be formed with CCSS structures having only two components, namely a $HT_cS$ line and a fixed (non-superconducting) resistor (which can be a metal line). Such structures are single level planar devices which are relatively easy to fabricate. In view of the simplicity of the basic CCSS structure, it is expected that logic circuits could be integrated much more densely than can be achieved with conventional semiconductor integrated circuits or with conventional Josephson Junction type logic circuits.

The resistive loss of a $HT_cS$ material is much less than that of good metal for operating frequencies lower than 100 GHz ($10^{11}$ Hertz). For most microwave applications (10-100 GHz), logic circuits constructed in accordance with the present invention should perform well. For higher frequency applications additional capacitor and inductor components would have to be included in the circuit, but this would necessitate analysis of and compensation for the impedances introduced by the additional components.

The normal state resistance of a $HT_cS$ element depends on the geometry of the material. For electronic applications, thin film $HT_cS$ materials are required. In-situ laser ablated YBCO films on MgO substrates have been successfully employed. Film deposition was carried out in a vacuum chamber with oxygen partial pressure of 100-200 mTorr. The substrate was kept at 750°-800° C. using a high temperature heater made by US Inc. An excimer pulse laser (248 nm) beam was focused onto a YBCO target with fluence of 1-3 J/cm². The films showed critical temperature above 88° K. and critical current density of greater than $1\times10^6$ A/cm² at 77° K. Typical normal state resistivity of a film is about 0.1 mΩ-cm at 100° K., corresponding to a sheet resistance of a few ohms per square measured by a four-point probe technique.

To operate as a switch, the normal state resistance of the $HT_cS$ material must match standard circuit resistance values, for example, a 50 Ω transmission line. This can be achieved by patterning the film into micron-sized striplines. Using a reactive patterning technique, such as that disclosed in "Novel method of patterning YBaCuO superconducting thin films", Q.Y. Ma et al Appl. Phys. Lett., 55, p. 896, (1989) various superconducting line structures with different lengths and widths have been fabricated. This method locally introduces Si into a YBCO film by a high temperature Si-YBCO reaction; this destroys the conductivity of the Si containing region. The technique is most effective for single level planar patterning. Prior to the YBCO film deposition, a thin layer of Si is evaporated onto an MgO substrate by electron-beam deposition. The Si film is patterned using conventional photolithography techniques. During the high temperature deposition of the YBCO film, the film above the Si patterned area becomes insulating due to the Si-YBCO interaction. The remaining areas define the superconducting structures. The resistances of the patterned structures were in the range of 10 Ω-100 kΩ. Those skilled in the art will understand that other fabrication techniques such as chemical etching, ion milling, lithography, etc. may be used to fabricate switch structures in accordance with the invention.

Logic circuits constructed in accordance with the present invention may be used to form superconducting digital electronic and/or superconductor-semiconductor hybrid circuits. Circuit breakers constructed in accordance with the present invention may be used to protect any low temperature electronic system including Josephson junction circuits, silicon integrated circuits operated at liquid nitrogen temperatures (77° K.), liquid nitrogen cooled supercomputers, and so on.

As will be apparent to those skilled in the art in the light of the foregoing disclosure, many alterations and modifications are possible in the practice of this invention without departing from the spirit or scope thereof. Accordingly, the scope of the invention is to be construed in accordance with the substance defined by the following claims.

What is claimed is:

1. A logic inverter gate comprising:
    (a) an input current source I;
    (b) a superconductor resistor electrically connected to said current source, said superconductor resistor having a critical current $I_c$, having a resistance of 0 ohms when $I<I_c$ and having a resistance of $R_s$ ohms when $I \geq I_c$;

(c) a first non-superconductor resistor electrically connected in series with said superconductor resistor, said first non-superconductor resistor having a resistance of r ohms and developing an output voltage $V_{out}$ in response to current flow through said first non-superconductor resistor;

(d) a second non-superconductor resistor electrically connected in parallel across said series-connected resistors, said second non-superconductor resistor having a resistance of R ohms;

wherein:

(e) $r<<R<<R_s$; and, (f) $I<I_c$ represents a first binary logical input signal to said gate, $I \geq I_c$ represents a second binary logical input signal to said gate, $V_{out} \approx I*r$ represents a first binary logical output signal of said gate, and $V_{out} \approx I*R*r/R_s$ represents a second binary logical output signal of said gate.

2. A logic inverter gate as defined in claim 1, wherein:

(a) said input current source I comprises an input AC current signal i and a DC bias current $I_B$;

(b) $I_B$ is slightly less than $I_c$; and, (c) i is selected such that $I=I_B+i>I_c$, or such that $I=I_B+i<I_c$.

3. A logic inverter gate as defined in claim 1, wherein said superconductor resistor is a superconducting film deposited on a substrate and patterned by reactive patterning.

4. A logic "NOR" gate comprising:

(a) first and second input current sources $I_a$ and $I_b$;

(b) a superconductor resistor electrically connected to said current sources, said superconductor resistor having a critical current $I_c$, having a resistance of 0 ohms when $I_a<I_c$ and $I_b<I_c$, and having a resistance of $R_s$ ohms when $I_a \geq I_c$ or $I_b \geq I_c$;

(c) a first non-superconductor resistor electrically connected in series with said superconductor resistor, said first non-superconductor resistor having a resistance of r ohms and developing an output voltage $V_{out}$ in response to current flow through said first non-superconductor resistor;

(d) a second non-superconductor resistor electrically connected in parallel across said series-connected resistors, said second non-superconductor resistor having a resistance of R ohms;

wherein:

(e) $r<<R<<R_s$; and, (f) $I_a<I_c$ and $I_b<I_c$ represents a first binary logical input signal to said gate, $I_a \geq I_c$ and/or $I_b \geq I_c$ represents a second binary logical input signal to said gate, $V_{out} \approx I*r$ represents a first binary logical output signal of said gate, and $V_{out} \approx I*R*r/R_s$ represents a second binary logical output signal of said gate, where $I=I_a+I_b$.

5. A logic "NOR" gate as defined in claim 4, further comprising a DC bias current $I_B$ electrically connected to said superconductor resistor, and wherein:

(a) $I_B<I_c$;

(b) said first binary logical input signal is represented by $I_B+I_a<I_c$ and $I_B+I_b<I_c$; and, (c) said second binary logical input signal is represented by $I_B+I_a \geq I_c$ and/or $I_B+I_b \geq I_c$.

6. A logic "NOR" gate as defined in claim 4, wherein said superconductor resistors are superconducting films deposited on a substrate and patterned by reactive patterning.

7. A logic "NAND" gate comprising:

(a) a plurality of current sources $I_k$, where $k=1, 2, \ldots, n$ and $n \geq 2$;

(b) a corresponding plurality of superconductor resistors electrically connected in parallel with one another and to said current sources, said superconductor resistors each having a critical current $I_c$, each having a resistance of 0 ohms when conducting a current less than $I_c$, and each having a resistance of $R_s$ ohms when $\Sigma I_k \geq n*I_c$;

(c) a first non-superconductor resistor electrically connected in series with said superconductor resistors, said first non-superconductor resistor having a resistance of r ohms and developing an output voltage $V_{out}$ in response to current flow through said first non-superconductor resistor;

(d) a second non-superconductor resistor electrically connected in parallel across said previously mentioned resistors, said second non-superconductor resistor having a resistance of R ohms;

wherein:

(e) $r<<R<<R_s/n$; and, (f) $0<I_k<I_c/n$ represents, for at least one value of k, a first binary logical input signal to said gate; $I_c<I_k<(n+1)I_c/n$ represents, for all values of k, a second binary logical input signal to said gate; $V_{out} \approx I*r$ represents a first binary logical output signal of said gate; and, $V_{out} \approx I*R*r*n/R_s$ represents a second binary logical output signal of said gate where $I=\Sigma I_k$.

8. A logic "NAND" gate as defined in claim 7, further comprising a DC bias current $I_B$ electrically connected to said superconductor resistors, and wherein:

(a) $I_B<n*I_c$; and, (b) said input current sources $I_k$ are selected such that $I_B+I_k<I_c$ for every value of k.

9. A logic "NAND" gate as defined in claim 7, wherein said superconductor resistors are superconducting films deposited on a substrate and patterned by reactive patterning.

10. A circuit breaker for preventing a current I flowing through a circuit having an effective resistance $r_L$ from exceeding a critical current $I_c$, said circuit breaker comprising:

(a) a source of said current I;

(b) a superconductor resistor electrically connected in series with said circuit and connected to said current source, said superconductor resistor having a critical current $I_c$, having a resistance of 0 ohms when $I<I_c$ and having a resistance of $R_s$ ohms when $I \geq I_c$; and, (c) a non-superconductor resistor electrically connected in parallel across said series-connected superconductor resistor and superconductor circuit, said non-superconductor resistor having a resistance of $R_L$ ohms;

wherein $r_L<<R_L<<R_s$.

11. A circuit breaker as defined in claim 10, wherein said superconductor resistor is a superconducting film deposited on a substrate and patterned by reactive patterning.

12. A circuit breaker as defined in claim 10, wherein said non-superconductor resistor is a light emitting diode.

13. A circuit breaker as defined in claim 10, wherein said non-superconductor resistor is an alarm device.

14. An analog to digital converter for representing the magnitude of an input analog current signal I as a plurality of binary voltage signals $V_1, V_2, \ldots V_n$, each of said voltage signals corresponding to a selected magnitude portion of said analog signal, said analog to digital converter comprising a plurality of current controlled superconductor switches, each of said switches comprising a superconductor resistor electrically connected in parallel with a non-superconductor resistor, said superconductor resistor having a critical current $I_c$, having no electrical resistance to current flow less than $I_c$ and having positive electrical resistance to current flow greater than or equal to $I_c$, said switches being arranged in a plurality of tiers $R_1, R_2, \ldots R_n$ with said first tier $R_1$ comprising one of said switches, said second tier $R_2$ comprising two of said switches electrically connected in parallel, said third tier $R_3$ comprising three of said switches electrically connected in parallel, and each successive tier $R_i$ comprising an integer number i of said switches electrically connected in parallel, said tiers being electrically connected in series, whereby said voltage signal $V_1$ is developed across said tier $R_1$, $V_1$ is larger than a first threshold value when $I \geq I_c$, and $V_1 \approx 0$ when $I < I_c$, said voltage signal $V_2$ is developed across said tier $R_2$, $V_2$ is larger than said threshold value when $I \geq 2*I_c$, and $V_2 \approx 0$ when $I < 2*I_c$ said voltage signal $V_3$ is developed across said corresponding tier $R_3$, $V_3$ is larger than said threshold value when $I \geq 3*I_c$, and $V_3 \approx 0$ when $I < 3*I_c$ and each successive tier $R_i$ develops a corresponding voltage signal $V_i$ which is larger than said threshold value when $I \geq i*I_c$.

15. An analog to digital converter as defined in claim 14, further comprising an encoder for encoding said voltage signals $V_1, V_2, \ldots V_n$, as coded signals $B_0, B_1, \ldots B_k$, where $k < n$.

16. An analog to digital converter for representing the magnitude of an input analog current signal I as a plurality of binary voltage signals $V_1, V_2, \ldots V_n$, each of said voltage signals corresponding to a selected magnitude portion of said analog signal, said analog to digital converter comprising a plurality of superconductor resistors each having a critical current $I_c$, having no electrical resistance to current flow less than $I_c$ and having positive electrical resistance to current flow greater than or equal to $I_c$, said superconductor resistors being arranged in a plurality of tiers $R_1, R_2, \ldots R_n$ with said first tier $R_1$ comprising one of said superconductor resistors, said second tier $R_2$ comprising two of said superconductor resistors electrically connected in parallel, said third tier $R_3$ comprising three of said superconductor resistors electrically connected in parallel, and each successive tier $R_i$ comprising an integer number i of said superconductor resistors electrically connected in parallel, said tiers being electrically connected in series, whereby said voltage signal $V_1$ is developed across said tier $R_1$, $V_1$ is greater than a first threshold value when $I \geq I_c$, and $V_1 \approx 0$ when $I < I_c$ said digital voltage signal $V_2$ is developed across said tier $R_2$, $V_2$ is greater than said first threshold value when $I \geq 2*I_c$, and $V_1 \approx 0$ when $I < 2*I_c$, said digital voltage signal $V_3$ is developed across said corresponding tier $R_3$, $V_3$ is greater than said first threshold value when $I \geq 3*I_c$, and $V_3 \approx 0$ when $I < 3*I_c$, and each successive tier $R_i$ develops a corresponding digital voltage signal $V_i$ which is greater than said first threshold value when $I \geq i*I_c$.

17. An analog to digital converter as defined in claim 16, further comprising an encoder for encoding said voltage signals $V_1, V_2, \ldots V_n$, as coded signals $B_0, B_1, \ldots B_k$, where $k < n$.

* * * * *